United States Patent [19]

Gaultier et al.

[11] Patent Number: 5,007,026
[45] Date of Patent: Apr. 9, 1991

[54] METHOD FOR THE TESTING OF ONE TIME PROGRAMMABLE MEMORIES AND CORRESPONDING MEMORY

[75] Inventors: Jean-Marie Gaultier, Rousset sur Arc; Augustin Farrugia, La Ciotat; Bertrand Conan, Aix-en-Provence, all of France

[73] Assignee: SGS-Thomson Microelectronics S.A., Gentilly, France

[21] Appl. No.: 326,618

[22] Filed: Mar. 21, 1989

[30] Foreign Application Priority Data

Mar. 25, 1988 [FR] France .................................. 88 03918

[51] Int. Cl.$^5$ .............................................. G11C 13/00
[52] U.S. Cl. .............................. 365/201; 365/189.01; 365/230.06; 371/28
[58] Field of Search ....................... 365/230.01, 230.06, 365/230.08, 189.01, 189.05; 371/21.4, 28

[56] References Cited

U.S. PATENT DOCUMENTS 4,958,324 9/1990 DeVin ................................. 365/201

Primary Examiner—Terrell W. Fears
Attorney, Agent, or Firm—Roland Plottel

[57] ABSTRACT

The disclosure relates to one time programmable or OTP memories. When they are encapsulated in plastic packages, these electrically programmable memories can no longer be erased. Hence, they cannot be programmed in order to be tested before being sold to the customer, as they have to be delivered in non-programmable state. To enable the performance of certain tests, notably speed tests, to be made, it is proposed to simulate the programming of certain cells by prohibiting the reading of these cells when they are designated by the decoder. The memory then behaves as if it had both non-programmed cells and programmed cells (the cells for which the reading voltage is inhibited), whereas they actually comprise only non-programmed cells. A very simple logic circuit enables a simulation of a checkerboard pattern of programmed and non-programmed cells.

11 Claims, 2 Drawing Sheets

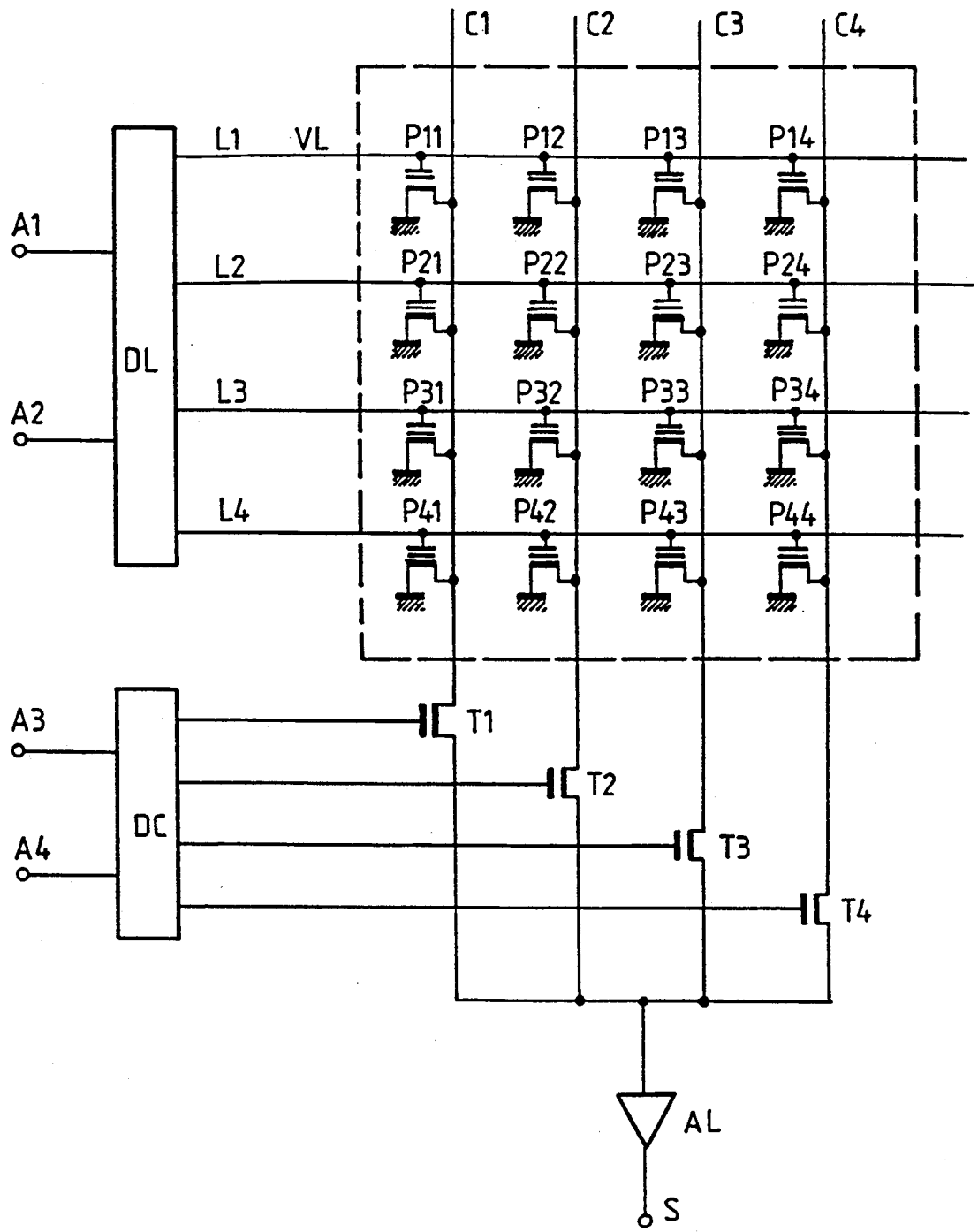
FIG_1

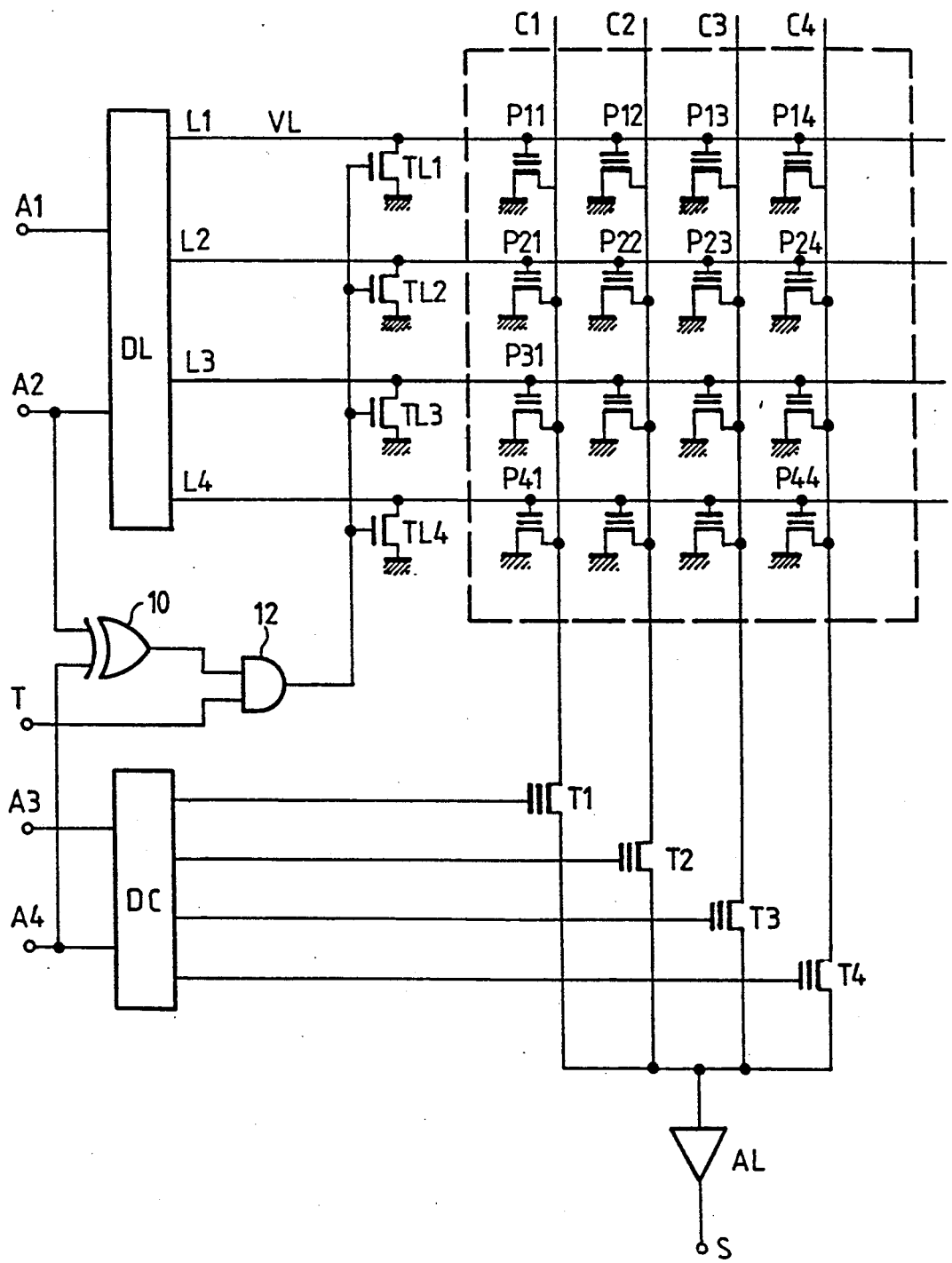
FIG_2

METHOD FOR THE TESTING OF ONE TIME PROGRAMMABLE MEMORIES AND CORRESPONDING MEMORY

BACKGROUND OF THE INVENTION

1. Field of the Invention

The invention concerns OTP or one time programmable memories.

2. Description of the Prior Art

These memories are EPROMS, namely electrically programmable non-volatile memories. However, unlike standard EPROMs which are provided with a window that is transparent to ultra-violet rays and which can be erased, through this window, by ultra-violet rays, and then reprogrammed electrically, OTP memories are encapsulated in an opaque package which is not transparent to ultra-violet rays. Once programmed, they can no longer be erased.

More precisely, each bit of the memory is initially in a non-programmed state. If it is programmed, it means that its state is changed, and the first state can no longer be returned to.

Most usually, each memory cell is formed by a transistor having a control gate and a floating gate. Through adequate biasing of the source, the drain and the control gate, this transistor can be programmed. This means that its floating gate is charged permanently. If the transistor is in its initial "non-programmed" state, it can be easily made conductive by a read voltage applied to its control gate. If it is in the "programmed" state (i.e. with its floating gate filled with electrons), it can no longer be made conductive by the same read voltage applied to its control gate.

It will be easily understood that it is very difficult to test memories of this type, at any rate after they have been encapsulated in their final, opaque package. For, they can no longer be programmed to be tested. They have to be sold in a blank state without any information, i.e. they can be marketed only in an non-programmed state, and the purchaser does the programming to place the information that he desires thereon. If there is no information in the memory, it is clearly impossible to perform certain tests on the exactness of the information stored, or on the quality of the access paths to this information. However, the purchaser would like to have guarantees on the product that he is going to purchase, and it would be desirable to perform certain tests.

For example, one useful test is a speed test wherein a check is made on the period that elapses between the instant when an address of the memory is designated and the instant when the information stored at this address is received at the output.

This test becomes highly imprecise if it is performed on a memory, all the transistors of which are in the non-programmed state. For, an attempt will be made to successively address different memory cells at very short intervals, and to ascertain the length of time at the end of which the information is received at output. However, since the information will always be the same, regardless of the cell addressed, there will be no real distinction made between the end of the preceding piece of information and the start of the following piece of information.

Besides, this is why, in non-OTP memories, speed tests are conducted on speed by recording a "checkerboard pattern" of information in the memory, i.e. every other transistor is programmed, and the successive addresses of the memory are read at great speed: the output information will alternately be a logic "0" and a logic "1", and it will be easy to check the maximum speed of access to the memory cells.

This access speed is notably limited by the memory's row and column decoding circuits, the input and output amplifiers, etc.

The present invention proposes a means to facilitate the testing of one time programmable memories, notably speed testing, but also the testing of faults in decoding circuits and of certain parts of the network of cells of the memory.

According to the invention, since the memory cells cannot be programmed to check the behaviour of the memory containing programmed cells and non-programmed cells, it is proposed to simulate programmed memory cells by non-programmed memory cells, for which the addressing in read mode will have been inhibited, to make it look as if they are programmed. This concept could be stated in another way: if a particular memory cell is designated by means of a read voltage applied by a decoder to this memory cell, and if the state of the memory cell is read on a column conductor, there are two possibilities: either the memory cell is not programmed and the transistor that forms it will give a current showing that it is effectively not programmed, or else the memory cell is programmed and then it can no longer be made conductive by the read voltage applied by the decoder, and in this case, no current flows or is detected on the column conductor. But then, if no current is detected, the column conductor behaves exactly as if the memory cell were not at all addressed. It behaves as if it did not receive the read voltage coming from the decoder or as if it were not connected to the output of the memory.

The idea of the invention therefore consists in:
applying, to a decoder, successive addresses of the memory cells to be tested;
making the decoder apply a read voltage to these cells so that, at the output of the memory, they give a piece of information on their state;
inhibiting the read process when certain memory cells are designated by the decoder so that these points behave, when seen from the output, like cells which are in a different state from the state in which they actually are; during this inhibition, the decoder addresses no additional memory cells which would be reserved for the test.

The inhibition of the reading operation may consist in preventing the application of a read voltage to the designated memory cells or, again, in preventing the information read at the column from being transmitted to the output of the memory.

Thus, all the cells which shall be designated by inhibited addressing signals could be considered to be programmed cells of the memory, whereas they are not so in reality.

Thus, a simulation is made of the desired contents of a memory, all the cells of which are, in fact, in the same non-programmed state, and the behaviour of the memory for which the contents are thus simulated is observed.

For example the contents, in checkerboard pattern, of a memory will be simulated by inhibiting the transmission of the address signals to the memory cells for one cell out of two, and in permitting it for the following cell. It is also possible to simulate other patterns than a checkerboard pattern, the simplest pattern being one of alternating rows of programmed cells and non-programmed cells. More complicated patterns can be envisaged without any difficulty in theory, but they would necessitate additional, specific decoding circuits in the memory integrated circuit, and the more complicated the pattern, the greater would be the space occupied by these additional, specific decoding circuits. Hence, they will not be used to excess.

For, it is the integrated circuit, comprising the memory, that will include specific auxiliary circuits enabling this simulation of memory contents during the test.

SUMMARY OF THE INVENTION

The memory according to the invention comprises a network of memory cells, the state of which can be read selectively by means of at least one decoder capable of receiving a memory cell selection address and capable of transmitting a read voltage to a selected memory cell, said memory comprising a test mode terminal designed to receive a signal indicating whether the memory has to work normally or has to be tested; said memory comprising a specific circuit checked by the test mode terminal to permit, in test mode, the inhibition of the reading of certain memory cells when the address of these cells is received by the decoder, so that, seen from the output of the memory, these memory cells provide an intentionally erroneous piece of information on their state, and do so, besides, without selecting, through the decoder, additional rows or columns of memory cells reserved for the test.

This is what enables the simulation of programmed cells when they are not really programmed. And there is no additional row or column of memory elements reserved for the test.

In normal functioning mode, this specific circuit is evidently inhibited.

In the simple but particularly example where the simulated contents are contents in a checkerboard pattern, the specific circuit has switches controlled according to the state of the low significance bits of the row and column addresses of the memory. These switches enable the row conductor of a selected row to be short-circuited, or a column conductor to be "de-selected" when the row address corresponds to an odd-parity row (for example) and when, simultaneously, the received column address also corresponds to an odd-parity column (for example).

More generally, the specific circuit may be a logic circuit capable of inhibiting the application of a read voltage to a selected row, depending on the state of an address bit of this row.

It may also be a logic state capable of inhibiting the application of a read voltage to a selected row, as a function of the state of an address bit of a column selected at the same time as the row, the row address and the column address defining the position of a memory cell for which it is sought to mask the state.

Should the memory contents which it is desired to simulate be in a checkerboard pattern, the memory comprises a logic circuit capable of inhibiting the reading process for a selected row as a function of the value of the sum of an address bit of this row and an address bit of a column selected at the same time as the row, the row address and the column address defining the position of a memory cell, the state of which it is sought to mask. The selected bits will be, in principle, the low significance row and column bits.

The invention is especially worthwhile for one time programmable memories (EPROMS encapsulated in plastic packages), but can be applied to other types of memory.

BRIEF DESCRIPTION OF THE DRAWINGS

Other features and advantages of the invention will appear from the following detailed description, made with reference to the appended drawings, of which:

FIG. 1 gives a schematic view of a standard EPROM;

FIG. 2 shows a modification of the memory enabling the implementation of the invention.

DESCRIPTION OF A PREFERRED EMBODIMENT

To provide a clearer understanding of the invention, we shall show how it can be implemented when the aim is to simulate the contents, in a checkerboard pattern, of a point-by -oint addressable memory by means of a row decoder and a column decoder.

A memory of this type is shown in its standard form in FIG. 1. This figure shows a very simple example of a memory of 16 cells, arranged in a network of four rows and four columns, with one memory cell at the intersection of each row and each column.

The four rows take the form of four parallel conductors L1, L2, L3, L4 and the four columns take the form of four conductors C1, C2, C3, C4, perpendicular to the former set of conductors.

Each memory cell is designated by the reference Pij, where i represents the number of the row to which it belongs and j represents the number of the column. Thus, the cell P11 is the cell at the intersection of the row L1 with the column C1; the cell P12 is the one at the intersection of the row L1 with the column C2, and so on until the cell P44 which is at the intersection of the row L4 with the column C4.

Each memory cell is formed, in this example, by a floating gate transistor having a source, a drain, a floating gate and a control gate. The source is connected to an electrical ground common to the entire circuit, the drain is connected to the column to which the memory cell belongs, and the check gate is connected to the row to which the memory cell belongs.

Each memory cell can be designated individually, so that a piece of information can be read therein or written therein, through a row decoder DL and a column decoder BC.

The row decoder DL has as many outputs as there are rows in the memory network. It selects a particular row and applies a read voltage VL to it, enabling the non-programmed transistors to be made conductive but not enabling the programmed transistors to be made conductive. The non-selected rows do not receive this voltage VL. They are, for example, kept at the ground potential.

The column decoder has as many outputs as there are columns in the memory network. It selects a particular column to connect it to a read amplifier AL. The non-selected columns are not connected to this read amplifier. In the example shown, the column decoder has four outputs, each controlling a respective transistor (T1 to T4) in series between a respective column conductor and the read amplifier. The transistor T1 is controlled by the first output of the column decoder and is in series with the first column conductor C1. The transistor T2 is controlled by the second output of the decoder and is in series with the second column conductor C2, etc.

The row decoder and the column decoder are controlled by address signals. In a highly standard way, the memory plane has a number of rows which is a power of two ($2^n$) and a number of columns which is also a power of two ($2^p$). Then n inputs for the row decoder and p inputs for the column decoder are enough to define a row number between 1 and $2^n$ and a column number between 1 and $2^p$, each input receiving a binary signal with a logic level 0 or 1. The row address is defined by the binary signals at the inputs of the row decoder and the column address by the binary signals at the inputs of the column decoder.

The rows and columns are generally arranged in such a way that two addresses which differ only by their least significant bit correspond to the selection of two adjacent rows or columns. At any rate, this is what shall be assumed in the particular example described herein.

In this example, there are two row address inputs, A1 and A2, and it will be assumed that the input A2 corresponds to the least significant bit, namely that, irrespectively of the logic signal at A1, an odd parity row (L1 or L3) will be selected for a first logic level (for example zero) at the input A2 and that, on the contrary, an even parity row (L2 or L4) will be selected for the complementary logic level (level 1) at the input A2.

Similarly, there are two column address inputs A3 and A4. A4 corresponds to the least significant bit and enables either of two adjacent columns, in a group of columns defined by A3, to be chosen. The odd parity columns, for example, are designated by a logic level 0 at the input A4.

By imposing a row address and a column address, a row and a column are defined, hence a memory cell at the intersection of this row with this column and, by means of the amplifier L, the current flowing in the selected column is detected. This current is non-null if the memory cell has not been programmed and is null if the memory cell has been programmed. The binary information on the state of each memory cell is given by the output S of the read amplifier AL.

When it is desired to test a memory while it is blank (with no programmed memory cell), current should be read systematically at output irrespectively of the row and column address applied to the inputs A1 to A4. This does not provide for accurate testing of the access circuits to the memory and, especially, the speed of these circuits.

The modification made, by the invention, in the memory in order to make the test easier is shown by way of example in FIG. 2. This figure corresponds to a simple example wherein it is sought to test the response that would be given by the access circuits to the memory if the contents were to be in a checkerboard pattern of programmed cells alternating with non-programmed cells. This test is particularly useful because it represents severe conditions of use, since it forces the output S of the memory to give, in very quick succession, signals which change their state at each change in address (assuming, of course, that the successive addresses are applied in the order of the successive positions of row cells or column cells).

According to the invention, for certain addresses received on either of the decoders, access to the memory plane will be prevented so that it is not possible to read the current given by a transistor selected by one of these addresses. Of course, this access prevented only in the memory test mode.

For the all the addresses for which access is permitted, a reading will be made of an output current coming from a non-programmed transistor, made conductive by a read voltage VL at its control gate (but faults may be detected, if necessary, as was done previously).

For all the addresses for which access is inhibited, no output current will be read (but if a reading is done all the same, faults may be detected).

By alternating the application of addresses with permitted access and addresses with non-permitted access, it would be possible to test the behaviour, under speed, of the access circuits (row decoder, column decoder, read amplifier, etc.).

The example shown in FIG. 2 is a very simple one. It includes transistors (TL1, TL2, TL3, TL4) to prevent access, in test mode, between the row decoder and certain rows of the memory. These transistors enable these rows to be connected to the ground so that when a read voltage VL is applied by the decoder to one of these rows, this voltage is short-circuited and cannot be transmitted to the control gates of the transistors of this row.

However, an alternative embodiment could be provided wherein the transistors TL1 to TL4 are connected to inhibit the transmission of current between the column conductors and the output of the memory. The transistors TL1 to TL4 could be connected between the gates of the transistors T1 to T4 and the ground, so that they would serve to prevent any turning on of the transistors T1 to T4, hence any transmission of current to the read amplifier AL and, consequently, any transmission of information between the column conductors and the output S. This alternative embodiment is valuable, notably when the read amplifier works in differential mode with a reference input formed by a column of reference cells addressed by the row decoder DEL. In this case, the row conductors should not be short-circuited during the test.

The circuit for inhibiting access to certain rows includes, in addition to the transistors TL1 to TL4, inhibiting means to control these transistors. These means quite simply comprise logic gates receiving, firstly, a logic signal coming from a test mode terminal T and, secondly (in this example), the low significance address bits present at the terminal A2 (low significance row address bits), on the one hand, and the terminal A4 on the other hand (low significance column address bits).

The test mode terminal T gives a logic signal which it receives from outside the circuit and which indicates that the system is in normal operating mode or in test mode.

Access to a row is inhibited by connecting this row to the ground when the address of this row is given to the row decoder, provided that the system is in test mode. However, in the example shown, the inhibition is more general to enable easy simulation of a checkerboard pattern with very limited logic means. For, here, all the rows will be grounded at the same time once the address of the memory cell designated by the row and column decoders corresponds to an address which it is sought to inhibit, namely once the chosen memory cell has to be fictitiously considered to be a programmed memory cell.

If the transistors TL1 to TL4 were to be used to "de-select" the columns rather than the rows, there would, preferably, also be provision for all the columns together to be de-selected when an address of a cell to be inhibited is transmitted.

The logic circuit used to simulate contents in a checkerboard pattern may comprise, as can be seen in FIG. 2, an exclusive-OR gate 10, a first input of which receives the low significance row address bit (present at the input A2) and a second input of which receives the low significance column address bit (present at the input A4).

The output of the exclusive-OR gate 10 gives a first logic level (0 for example) if the parity of the row address is the same as the parity of the column address, namely if a cell is selected either at the intersection of an odd parity row with an odd parity column, or at the intersection of an even parity row with an even parity column. The output of the exclusive-OR gate gives a second logic level which is complementary to the former one if the row and column parities are different.

The output of the OR-exclusive gate 10 is applied to an input of a logic gate 12 (AND gate for example), validated by the terminal T test mode signal, so that access to the row conductors can be inhibited only in the test mode.

The output of the gate 12 controls the transistors TL1 to TL4 to make them conductive and prevent access to the selected row, and also to all the other rows if, for example, the parities of the row and column addresses should be different.

The result thereof is the following mode of operation:

I. Normal mode

If the system is in normal operating mode (by contrast with the test mode), the gate 12 does not let through the output signals of the exclusive-OR gate 10, and none of the inhibition transistors TL1 to TL4 can be made conductive;

II. Test mode (a), if the row addressed has an odd parity (row L1 or L3), then the addressing of this row will be inhibited by the grounding of this row (and, moreover, of all the other rows) provided that the column address, given at the same time to the column decoder, also corresponds to an odd parity column (C1 or C3). If the column address is an even parity column address (designation of the columns C2 or C4), then the selected row will not be inhibited.

(b) if the addressed row has an even parity (selection of L2 or L4), it is the same thing: the addressing of the row will be inhibited if the parity of the column address is also even.

(c) On the whole, every other cell will be normally addressed. Its immediate row and column neighbours will not be addressed when the row and column decoders receive the addresses which are supposed to select them. They will give no current to the designated column and they will therefore behave, seen from the output S, like programmed memory cells that cannot be made conductive by the read voltage VL. We have thus really simulated a checkerboard of programmed memory cells alternating with non-programmed memory cells.

There is no difficulty in simulating other simple patterns of memory contents, for example, an alternation of rows of programmed cells and non-programmed cells. The AND gate 12 would quite simply have an input connected to the terminal T and another input connected to the input A2, the exclusive-OR gate being eliminated. Similarly, to simulate an alternation of columns of programmed cells and columns of non-programed cells, it would be enough to connect an input of the AND gate 12 to the input A4 in eliminating the exclusive-OR gate.

Other patterns of memory contents can be simulated by means of decoding circuits that receive certain row and column address bits to control the transistors TL1 to TL4 as a function of the addresses received at the input of the decoders.HERE The invention enables the detection of faults in the behaviour of the integrated circuit and the sorting out, in terms of speed, of the one time programmable read-only memories, even after encapsulation in opaque packages.

What is claimed is:

1. A one time programmable memory, comprising a memory having an array of memory cells, a decoder having inputs for receiving an address and outputs for addressing said cells, and a reading circuit for providing a signal corresponding to information which may be stored in the cells addressed by the decoder, said memory comprising a test mode terminal for receiving a test signal, and an inhibition circuit connected to said test mode terminal and to the reading circuit, said inhibition circuit comprising means enabled by said test signal for inhibiting the reading of the cells addressed by the decoder whenever the address received by the decoder has just predetermined values and for enabling the reading of the cells whenever the address has second predetermined values, whereby the signal provided by the reading circuit depends upon the address of cell received by the decoder and all cells are virgin cells.

2. A memory according to claim 1, wherein each cell is a binary memory cell having a virgin state prior to programmation, and wherein the reading circuit comprises means for providing a first specific signal when the addressed cell is in its virgin state and means for providing a second specific signal when the addressed cell is in its programmed state and wherein said inhibition circuit comprises means for forcing the reading circuit to supply said second specific signal in response to said test signal being present and addresses being received by the decoder.

3. A memory according to claim 2, wherein the cells comprise floating gate transistors.

4. A memory according to claim 1, wherein said memory has rows and columns of cells and wherein said inhibition circuit comprises means enabled by said test signal for preventing application of a read voltage to selected rows of the memory.

5. A memory according to claim 1, wherein said memory has rows and columns of cells and wherein said inhibition circuit comprises means enabled by said test signal for inhibiting the transmission of information between a column conductor and an output of the memory.

6. A memory according to claim 1, wherein said memory has rows and columns of cells and wherein said inhibition circuit comprises gate means enabled by said test signal, said gate means having inputs connected to at least one input of the decoder for receiving at least one bit of address of the memory.

7. A memory according to claim 1, wherein said memory has rows and columns of cells, each cell corresponding to a row binary address and a column binary address, wherein said inhibition circuit comprises means enabled by said test signal for inhibiting the reading of each cell having an address such that the sum of a given row address bit and a given column address bit has a predetermined value.

8. A memory according to claim 7, wherein said given row address bit is the least significant bit of the row address and said given column address bit is the least significant column address bit, and inhibition occurs for cells arranged in correspondence with a checkerboard pattern, said inhibition circuit comprising a logic gate receiving on a first input the least significant row address bit and on a second input the least significant column address bit.

9. A memory according to claim 8, wherein said inhibition circuit comprises a first gate having one input for receiving the least significant row address bit and another input for receiving the least significant column address bit, a second gate enabled by said test signal for receiving a output of said first gate, said second gate having an output connected to means for preventing application of a reading voltage to all rows of the memory, whereby said means for preventing are activated when said test signal is present and the sum of said bits has said selected value.

10. A memory according to claim 8, wherein said inhibition circuit comprises a first gate having one input for receiving the least significant row address bit and another input for receiving the least significant column address bit, a second gate enabled by said test signal for receiving an output of said first gate, said second gate having an output connected to means for preventing transmission of information from the cells to an output of the memory, whereby transmission is prevented when said test signal is present and the sum of said bits has said selected value.

11. A method for testing a one time programmable memory prior to programming, said memory comprising an array of memory cells, a decoder having inputs for receiving an address and outputs for addressing said cells, and a reading circuit for providing a signal corresponding to the information stored in cells addressed by the decoder, said method comprising:

applying a predetermined logic level to a test signal terminal of said memory, applying an address to an address input of the inhibiting the reading of the cells addressed by the decoder whenever the address received by the decoder has first predetermined values and enabling the reading whenever the address has other predetermined values, whereby the signal provided by the reading circuit depends upon the address of cell received by the decoder even though all cells are virgin cells prior to programmation of information into said memory.

* * * * *